(12) United States Patent
Rainbolt

(10) Patent No.: US 6,249,555 B1
(45) Date of Patent: Jun. 19, 2001

(54) LOW JITTER DIGITAL EXTRACTION OF DATA FROM SERIAL BITSTREAMS

(75) Inventor: Joey L. Rainbolt, Rough & Ready, CA (US)

(73) Assignee: Grass Valley (US) Inc., Nevada City, CA (US)

( * ) Notice: Subject to any disclaimer, the term of this patent is extended or adjusted under 35 U.S.C. 154(b) by 0 days.

(21) Appl. No.: 08/893,586

(22) Filed: Jul. 14, 1997

(51) Int. Cl.[7] ............................................. H04L 7/00
(52) U.S. Cl. .................... 375/354; 375/333; 375/359; 375/369
(58) Field of Search ................... 375/354, 359, 375/369, 333

(56) References Cited

U.S. PATENT DOCUMENTS

| | | | |
|---|---|---|---|
| 4,472,818 | 9/1984 | Zapisek et al. | 375/110 |
| 4,633,488 | 12/1986 | Shaw | 375/120 |
| 4,796,280 | 1/1989 | Nesin et al. | 375/110 |
| 4,929,849 | 5/1990 | Paul | 307/269 |
| 5,150,386 | 9/1992 | Stern et al. | 375/118 |
| 5,162,746 | 11/1992 | Ghoshal | 328/155 |
| 5,164,966 * | 11/1992 | Hershberger | 375/359 |
| 5,229,998 | 7/1993 | Weisser | 370/108 |
| 5,245,635 | 9/1993 | Martinez et al. | 375/110 |
| 5,297,180 | 3/1994 | Upp et al. | 375/112 |
| 5,404,362 | 4/1995 | Meitner | 371/47.1 |
| 5,465,268 * | 11/1995 | Rainbolt | 375/333 |
| 5,475,715 * | 12/1995 | Hase et al. | 375/354 |
| 5,491,729 | 2/1996 | Co et al. | 375/376 |
| 5,539,784 | 7/1996 | Brauns et al. | 375/360 |
| 5,579,351 | 11/1996 | Kim | 375/371 |
| 5,592,515 | 1/1997 | Saban et al. | 375/340 |
| 5,598,443 | 1/1997 | Poeppleman | 375/359 |
| 5,623,522 * | 4/1997 | Ito | 375/369 |

* cited by examiner

Primary Examiner—Stephen Chin
Assistant Examiner—Shuwang Liu
(74) Attorney, Agent, or Firm—Kenyon & Kenyon

(57) ABSTRACT

A low jitter method for extracting clock or data from a serial digital bitstream generates from a digital decoder a window signal from the serial digital bitstream by sampling the serial digital bitstream with a sample clock signal. The window signal envelops a specified transition of the serial digital bitstream, and is used as a gate input to an AND circuit to extract the clock signal or desired data from the bitstream without introducing jitter. The clock signal may then be used to clock out data previously extracted by the digital decoder.

7 Claims, 2 Drawing Sheets

LOW JITTER DIGITAL EXTRACTION OF DATA FROM SERIAL BITSTREAMS

BACKGROUND OF THE INVENTION

The present invention relates to digitally decoding of data information from serial digital bitstreams, and more particularly to low jitter data extraction from serial digital bitstreams.

Prior methods for digitally decoding clock or data information from a serial digital bitstream using asynchronous digital techniques have had the undesirable effect of adding jitter to the resulting output. Information may be encoded into serial bitstreams in a variety of ways. The more efficient methods are often more complex in their structure. For example, the individual bit cells may be of varying width or the polarity of the signal may be unknown. For these and other reasons it frequently is advantageous to use digital techniques to recover information from a serial bitstream. One technique, known as digital sampling, uses a higher frequency clock to "sample" the lower speed serial bitstream. The computational efficiency of this method has been used successfully to decode AES/EBU audio and has been previously disclosed in U.S. Pat. No. 5,465,268 issued Nov. 7, 1995 to Joe L. Rainbolt entitled "Digital Decoding of Biphase-Mark Encoded Serial Digital Signals." A disadvantage in some applications of the sampling method is that the resolution of the samples is limited by the sample clock itself. This leads to a temporal uncertainty (jitter) of at least one clock sample period in the decoded output. This jitter is caused by the precession of the sample phase relative to the phase of the bitstream data which results from the sample clock and bitstream data being asynchronous. It is possible to remove this jitter using a buffer memory. However that requires additional circuitry.

What is desired is a digital decoding method for extracting clock and data information from serial bitstreams that uses a digital sampling technique that does not introduce sampling clock jitter.

BRIEF SUMMARY OF THE INVENTION

Accordingly the present invention provides a low jitter method for digital extraction of data from a serial digital bitstream by generating from the serial bitstream, using a sample clock, a window signal that envelops desired transitions within the serial bitstream. The window signal is then used to extract a clock signal or data from the serial bitstream without introducing jitter.

The objects, advantages and other novel features of the present invention are apparent from the following detailed description when read in conjunction with the appended claims and attached drawing.

DETAILED DESCRIPTION OF THE INVENTION

Figure 1:
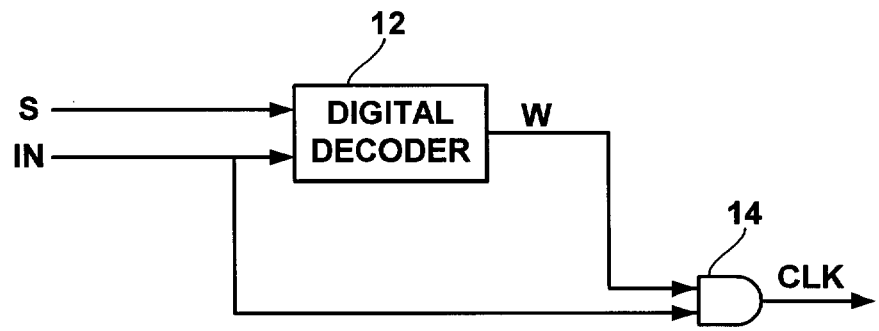
FIG. 1 is a simple block diagram view of a low jitter clock extraction from a serial digital bitstream according to the present invention.

Referring now to FIG. 1 an arbitrarily complex serial digital bitstream IN together with a sample clock signal S are input to a digital decoder 12. The digital decoder 12 digitally samples the bitstream IN with the sample clock signal S, but instead of extracting the data itself, it decodes the temporal position of the transitions in the bitstream. The digital decoder 12 then forms a window signal W that completely envelops the expected position of a particular transition in the serial bitstream IN. The window signal W and the serial digital bitstream IN are input to an AND circuit 14, where the window signal acts as a gate to allow the transition in the bitstream to be used as a clock output CLK. The transition to be decoded may be each bit cell boundary or any other component of the bitstream.

Figure 2:
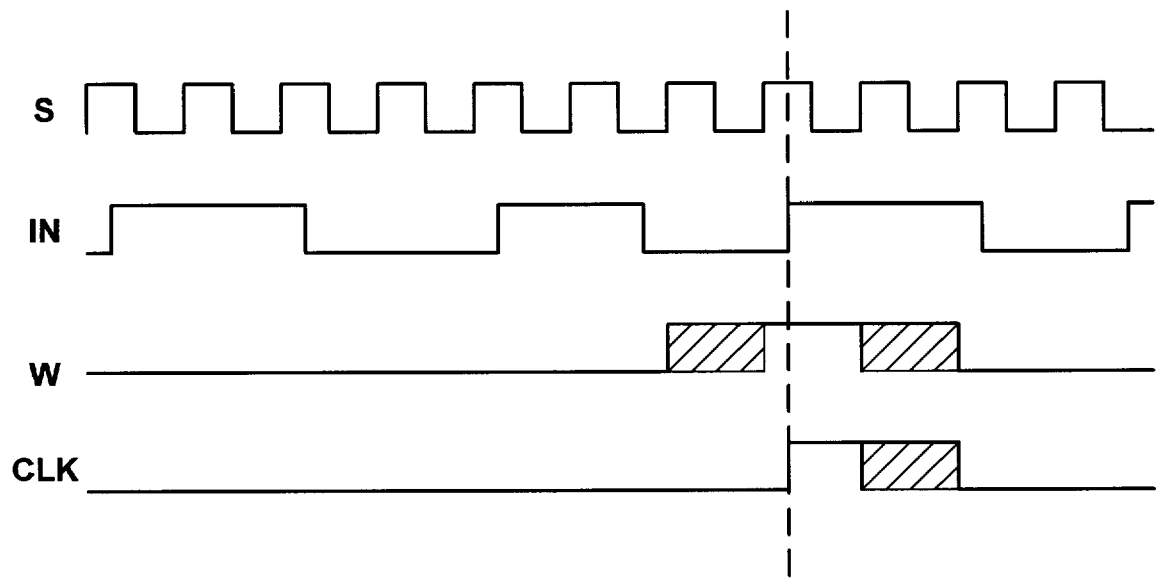
FIG. 2 is a timing diagram view for the circuit shown in FIG. 1.

As shown in FIG. 2 none of the jitter represented by the shaded areas of the digitally decoded window signal W is imposed on the rising edge of the clock output CLK. Once the low jitter clock output CLK is developed, it may be used to clock out other data previously extracted by the digital decoder. CLK may be used directly or, if jitter reduction is desired, it is well suited for use as an input to a phase locked loop (PLL). Because CLK already has relatively low jitter, a low speed PLL may be used to achieve significant jitter reduction.

Figure 3:
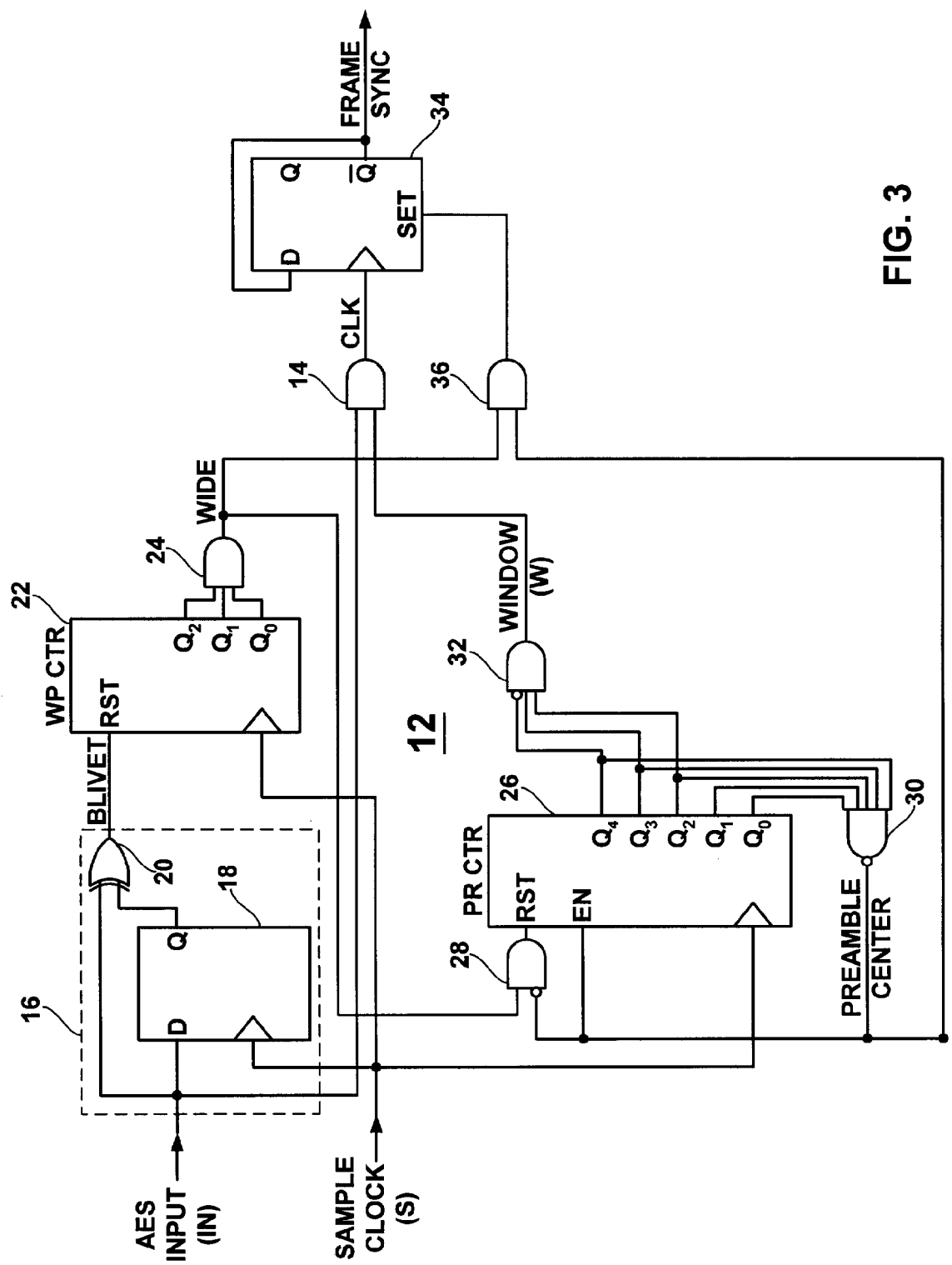
FIG. 3 is a block diagram view of a specific implementation applied to AES/EBU serial bitstreams for extracting frame sync according to the present invention.

Referring now to FIG. 3, using this method a sample clock is extracted from an AES/EBU serial digital audio bitstream. The digital decoder 12 has a blivet signal generator 16 of a D-type flip-flop 18 and an exclusive OR gate 20. The blivet signal is produced for one sample clock S on each edge of the AES/EBU input signal. A wide pulse counter 22 is reset by the blivet signal on each edge of the input signal, and otherwise counts up the number of sample clocks until it is reset. If the count output from the wide pulse counter 22 reachs seven as determined by an AND gate 24, a wide signal is generated that indicates a wide pulse has been detected, which only occurs during preambles in the AES/EBU input signal.

Since more than one wide pulse may occur per preamble in the AES/EBU input signal, a preamble counter 26 is used to block additional wide pulses and to open the window signal W. The additional wide pulses are blocked by the action of an AND gate 28 at the reset input of the preamble counter 26. Thus the reset only occurs if the counter 26 has reached its terminal count of thirty-one, as determined by NAND gate 30. The output from the NAND gate 30 is a preamble count enable signal which is low if the wide pulse is true at the input to AND gate 28. Reset on the preamble counter 26 causes its outputs to go to zero and the preamble count signal goes high. Additional wide pulses are then ignored. The next time the counter output, as determined by the NAND gate 30, reaches thirty-one, the current preamble in the AES/EBU input signal will have passed and the counter 26 can accept another reset from the wide signal. The window signal W is developed by AND gate 32 from the outputs of the preamble counter 26 so that the window signal overlaps the expected position of a transition in the AES/EBU input signal.

In this implementation the data to be extracted is the 48 kHz component of the AES/EBU serial bit stream. The clock signal CLK is developed as the logical AND combination from the AES/EBU input signal and the window signal. Since the clock signal is ultimately driven from a transition in the input signal itself, little or no jitter is added to an output signal FRAME SYNC by the decoding process. The clock signal occurs at the preamble rate, which is 98 kHz, so it is divided by two using flip-flop 34. The wide and preamble enable signals are further used via AND gate 36 as a means to synchronize the polarity of the FRAME SYNC signal to the input serial bitstream. The coincidence of these two signals occurs only during the preambles for one of the two audio channels embedded in the AES/EBU bitstream.

This method uses digital sampling techniques without introducing sampling clock jitter, is inexpensive to implement, and is well suited for field programmable gate array (FPGA) or standard cell application specific integrated circuit (ASIC) technologies. Although the specific implementation described is designed to extract the 48 kHz frame sync from an AES/EBU serial bitstream, this method of low jitter extraction may easily be extended to extract any or all of the data contained within the bitstream. The key is that, once the window signal is developed, it may be used to extract any data of interest within the bitstream without adding jitter.

Thus the present invention provides for low jitter digital extraction of data from serial bitstreams by generating a window signal from the input bitstream that brackets the transitions within the input bitstream, which window signal may then be used to extract the desired data from the serial bitstream.

What is claimed is:

1. A method of extracting an audio clock from a serial digital AES/EBU audio bitstream comprising the steps of:

generating a blivet signal for each transition of the serial digital AES/EBU audio bitstream as a function of the serial digital AES/EBU audio bitstream and a sample signal;

counting the blivet signal as a function of the sample clock to produce a wide signal indicating a preamble in the serial digital AES/EBU audio bitstream;

producing from the wide signal and the sample clock a window signal centered upon a transition corresponding to the preamble;

combining the window signal with the serial digital AES/EBU audio bitstream to produce the audio clock.

2. An apparatus for extracting an audio clock from a serial digital AES/EBU audio bitstream comprising:

means for generating a blivet signal for each transition of the serial digital AES/EBU audio bitstream as a function of the serial digital AES/EBU audio bitstream and a sample signal;

means for counting the blivet signal as a function of the sample clock to produce a wide signal indicating a preamble in the serial digital AES/EBU audio bitstream;

means for producing from the wide signal and the sample clock a window signal centered upon a transition corresponding to the preamble;

means for combining the window signal with the serial digital AES/EBU audio bitstream to produce the audio clock.

3. The apparatus as recited in claim 2 wherein the generating means comprises:

an input flip-flop having the serial digital AES/EBU audio bitstream applied at a D-input and the sample clock at a clock input, and having an output; and an exclusive OR gate having the serial digital AES/EBU audio bitstream as a first input and the output from the input flip-flop as a second input, and providing at an output the blivet signal.

4. The apparatus as recited in claim 2 wherein the counting means comprises:

a first counter having the blivet signal applied at a reset input and the sample clock at a clock input, and having a count output; and a wide AND gate having the count output applied as inputs and providing the wide signal as an output.

5. The apparatus as recited in claim 2 wherein the producing means comprises:

a preamble counter having a reset input, a clock input to which the sample clock is applied and an enable input, and having a preamble count output;

a NOR gate having the preamble count output as inputs and providing a preamble enable signal as an output, the preamble enable signal being applied to the enable input;

an input AND gate having the wide signal and the preamble enable signal as inputs and having an output coupled to the reset input; and a window AND gate having a portion of the preamble count output as inputs, and producing the window signal as an output.

6. The apparatus as recited in claim 2 wherein the combining means comprises:

an output AND gate having the window signal and the serial digital AES/EBU audio bitstream as inputs and producing an intermediate clock signal as an output; and a divider having the intermediate clock as an input and producing the audio clock as an output.

7. The apparatus as recited in claim 6 wherein the combining means further comprises a polarity AND gate having as inputs the wide signal and a preamble enable signal from the producing means, and providing a polarity signal as an output, the polarity signal being applied to a set input of the divider to set the polarity of the audio clock.

* * * * *